United States Patent
Yamada

(10) Patent No.: US 10,374,513 B2
(45) Date of Patent: Aug. 6, 2019

(54) AC-DC CONVERTER

(71) Applicant: Fuji Electric Co., Ltd., Kanagawa (JP)

(72) Inventor: Ryuji Yamada, Tokyo (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/056,168

(22) Filed: Aug. 6, 2018

(65) Prior Publication Data
US 2019/0097532 A1   Mar. 28, 2019

(30) Foreign Application Priority Data

Sep. 27, 2017 (JP) .................................. 2017-185694

(51) Int. Cl.
*H02M 1/42* (2007.01)
*H02M 3/156* (2006.01)
(Continued)

(52) U.S. Cl.
CPC ............ *H02M 3/156* (2013.01); *H02H 7/125* (2013.01); *H02M 1/4225* (2013.01);
(Continued)

(58) Field of Classification Search
CPC ........ H02M 1/42; H02M 1/44; H02M 1/4208; H02M 1/4225; H02M 1/4233;
(Continued)

(56) References Cited

U.S. PATENT DOCUMENTS 7,102,341 B1   9/2006  Choudhury
7,135,845 B2   11/2006  Zverev et al.
(Continued)

FOREIGN PATENT DOCUMENTS

JP   2006-87288 A   3/2006
JP   2016-93001 A   5/2016

OTHER PUBLICATIONS

U.S. Appl. No. 16/123,282, filed Sep. 6, 2018.
(Continued)

*Primary Examiner* — Gary L Laxton
*Assistant Examiner* — Ivan Laboy
(74) *Attorney, Agent, or Firm* — Chen Yoshimura LLP

(57) ABSTRACT

An AC-DC converter that converts an AC power supply voltage to a DC output voltage of a prescribed magnitude with power factor regulation includes a voltage regulation unit; an instantaneous value command calculator; a current regulation unit; an output voltage command calculator; a drive signal generator that generates a drive signal for a semiconductor switching device from the output voltage command and a carrier signal, the driving signal being provided to the semiconductor switching device so as to switch the semiconductor switching device ON and OFF; and a rectified voltage estimation unit that that derives an estimated value of a rectified voltage obtained by rectifying the AC power supply voltage from the output voltage command without actually detecting a rectified voltage, for providing to the instantaneous value command calculator and the output voltage command calculator.

12 Claims, 8 Drawing Sheets

(51) Int. Cl.
*H02H 7/125* (2006.01)
*H02M 7/25* (2006.01)
*H03K 17/082* (2006.01)

(52) U.S. Cl.
CPC ........... *H02M 1/4258* (2013.01); *H02M 7/25* (2013.01); *H03K 17/082* (2013.01); *H02M 1/4233* (2013.01)

(58) Field of Classification Search
CPC .... H02M 1/4258; H02M 1/155; H02M 1/156; H02M 1/157; H02M 1/158; H03K 17/082; H02H 7/125; Y02B 70/12; Y02B 70/126
See application file for complete search history.

(56) References Cited

U.S. PATENT DOCUMENTS

| | | | |
|---|---|---|---|
| 8,085,562 B2 | 12/2011 | Sisson | |
| 2005/0013076 A1 | 1/2005 | Zverev et al. | |
| 2005/0270814 A1* | 12/2005 | Oh | H02M 1/4225 363/98 |
| 2006/0013026 A1* | 1/2006 | Frank | H02M 1/4225 363/89 |
| 2006/0031736 A1 | 2/2006 | Fahlenkamp et al. | |
| 2006/0043956 A1 | 3/2006 | Clavette | |
| 2007/0103949 A1* | 5/2007 | Tsuruya | H02M 1/4225 363/125 |
| 2008/0130336 A1* | 6/2008 | Taguchi | H02M 1/4225 363/125 |
| 2009/0273330 A1 | 11/2009 | Sisson | |
| 2010/0110739 A1* | 5/2010 | Nishikawa | H02M 1/4225 363/124 |
| 2010/0270984 A1* | 10/2010 | Park | H02M 1/4225 323/211 |
| 2013/0094255 A1* | 4/2013 | Yeh | H02M 1/4208 363/44 |
| 2013/0221936 A1* | 8/2013 | Ku | H02M 1/4225 323/205 |
| 2013/0307497 A1* | 11/2013 | Chen | H02M 3/1563 323/235 |
| 2014/0233279 A1* | 8/2014 | Kondo | H02M 7/217 363/37 |
| 2015/0146458 A1* | 5/2015 | Lim | H02M 3/158 363/44 |
| 2015/0372614 A1* | 12/2015 | Yamada | H02M 3/156 363/89 |
| 2016/0301305 A1* | 10/2016 | Yamada | H02M 3/156 |
| 2016/0344282 A1* | 11/2016 | Lin | H02M 1/4225 |
| 2019/0044434 A1* | 2/2019 | Elferich | H02M 1/08 |

OTHER PUBLICATIONS

Brown et al., "PFC Converter Design with IR1150 One Cycle Control IC. Application Note AN-1077.", International Rectifier, [online], Published Jun. 2005, Searched Sep. 11, 2017, Internet (URL: Hyperlink "https://www.infineon.com/dgdl/an-1077.pdf?fileId=5546d462533600a40153559563801007") (Mentioned in paragraph Nos. 7-8 and 13 of the as-filed specification.).

* cited by examiner

AC-DC CONVERTER

BACKGROUND OF THE INVENTION

Technical Field

The present invention relates to an AC-DC converter such as a so-called power factor correction (PFC) circuit and to a technology for improving power factor (input power factor) by controlling an AC input current to be a sine wave having the same phase as an AC input voltage.

Background Art

FIG. 4 illustrates a PFC circuit described in Patent Document 1 which is driven using a one-cycle power factor control scheme described below. In FIG. 4, REC is a diode rectifier circuit, L is a reactor, 100 is an integrated circuit, 120 is a voltage conversion circuit, 130 is a voltage-dividing circuit, Q1 is a semiconductor switching device such as a MOSFET, and $R_s$ is a current sense resistor.

The switching device Q1 is driven by a gate signal output from a terminal 8 of the integrated circuit 100, and the input power factor is kept at a value substantially equal to 1 by controlling the AC input current of the PFC circuit to have the same phase as an AC input voltage $V_{in}$. Here, the output current (the current of the reactor L) of this circuit is converted to a voltage by the current sense resistor $R_s$ and then input to a terminal 3 of the integrated circuit 100.

FIG. 5 illustrates the internal configuration of the integrated circuit 100. Note that the terminal numbers 1 to 8 of the integrated circuit 100 illustrated in FIG. 4 respectively correspond to terminals 1 to 8 illustrated on the left and right sides of FIG. 5.

In FIG. 5, a current sense signal input to the terminal 3 is converted, by a transconductance amplifier 103 and a capacitor on the output side thereof, to the average value of the equivalent current of the reactor L with the high-frequency components removed and provided to an adder 104. Here, the capacitance of the capacitor on the output side of the transconductance amplifier 103 is set to a value which allows the terminal voltage of the capacitor to be treated as being substantially constant for a period of time approximately equal to one switching cycle.

Meanwhile, an error amplifier (transconductance amplifier) 101 outputs, from the terminal 5, a current proportional to the error between a DC output voltage command value $V_{REF}$ and a voltage detection value $V_{FB}$ from the voltage-dividing circuit 130 in FIG. 4. As illustrated in FIG. 4, the terminal 5 is connected to the voltage conversion circuit 120, which is constituted by two capacitors and a resistor. The voltage conversion circuit 120 takes as input the current output from the error amplifier 101 and applies a voltage $V_m$ to the terminal 5. In other words, the output voltage $V_m$ of the error amplifier 101 is generated by components such as the error amplifier 101 and the voltage conversion circuit 120.

The voltage of the terminal 5 of the integrated circuit 100 (that is, the output voltage $V_m$ of the error amplifier 101) is the amplified difference between the DC output voltage command value $V_{REF}$ and the voltage detection value $V_{FB}$. This voltage $V_m$ serves as a compensation voltage $V_{comp}$ for correcting the average value of the equivalent current of the reactor L from which the high-frequency components are removed and is added to the output voltage of the current sense amplifier (transconductance amplifier) 103 by the adder 104 in FIG. 5. This addition result is then input to the inverting input terminal of a PWM comparator 105.

Meanwhile, a transconductance amplifier 102 outputs a current corresponding to the output voltage $V_m$ of the error amplifier 101. This current charges a capacitor 108, thereby producing a ramp wave, and this ramp wave is input to the non-inverting input terminal of the PWM comparator 105. Moreover, the voltage of the capacitor 108 is reset by the inverted output of a flip-flop circuit 107 described below.

The output voltage of the transconductance amplifier 103 has a negative polarity when input to the adder 104. Therefore, as the current of the reactor L increases, the period during which the output of the PWM comparator 105 remains at a High level (that is, the period during which the switching device Q1 remains ON) becomes shorter, and the proportion of time during which an ON signal is not output to the switching device Q1 from the terminal 8 via the flip-flop circuit 107 increases. Thus, the current of the reactor L becomes balanced at a certain point in time, and the magnitude of the current at this balance point becomes greater the greater the instantaneous output voltage of the rectifier circuit (diode rectifier circuit) REC in FIG. 4 is (because the increase rate in the current of the reactor L is proportional to the instantaneous output voltage of the rectifier circuit (diode rectifier circuit) REC). As a result, the current of the reactor L and ultimately the AC input current becomes a sine wave similar to and having the same phase as the AC input voltage.

FIG. 6 is a waveform diagram which illustrates the relationship between the compensation voltage $V_{COMP}$ and the ramp wave and is taken from Patent Document 1 and Non-Patent Document 1.

As disclosed in these documents, in a one-cycle power factor control scheme, the slope of the ramp wave is adjusted proportionally to the output of the error amplifier 101 so that the amplitude of the ramp wave reaches the compensation voltage $V_{COMP}$ at the end of each switching cycle $T_s$. For example, for the compensation voltages $V_{COMP1}$ and $V_{COMP2}$ in FIG. 6, this approach would produce ramp waves 1 and 2.

Moreover, FIG. 7 is a waveform diagram illustrating the relationship between the ramp wave and the output voltage of the adder 104 and is substantially the same as the diagram illustrated in Non-Patent Document 1. The circuit in FIG. 5 described above can be regarded as being equivalent to a circuit which generates a gate signal by obtaining the intersection between the output voltage of the adder 104 and the ramp wave illustrated in FIG. 7.

In FIG. 7, a is a value proportional to the initial current of the reactor L when a switching cycle begins while in continuous current mode. Moreover, b is a value equivalent to the maximum current flowing through the reactor L immediately before the switching device Q1 switches OFF, and the average current for the period in which the switching device Q1 remains ON is equal to the average value of a and b in FIG. 7. As illustrated in FIG. 7, the greater the compensation voltage $V_{COMP}$ (that is, $V_{REF}-V_{FB}$) is, the greater the amount of current that can be passed becomes, which means that $V_{FB}$ can be made to converge on $V_{REF}$.

Furthermore, the higher the AC input voltage $V_{in}$ is, the greater the slope of the output voltage of the adder 104 becomes. This causes the input current to change in accordance with the instantaneous value of the AC input voltage $V_{in}$, thereby making it possible to improve the input power factor.

Next, FIG. 8 illustrates the configuration of a PFC circuit disclosed in Patent Document 2.

In the main circuit in FIG. 8, AC is an AC power supply (a commercial power supply), C1 and C2 are capacitors, R1 to R4 are voltage-dividing resistors, D1 is a diode, LOAD is a load such as a DC/DC converter, and the rest of the components have the same reference characters as in FIG. 4.

Moreover, in a control circuit for switching the switching device Q1 ON and OFF, AVR is a voltage regulator (an Auto Voltage Regulator) constituted by a proportional integral (PI) controller or the like, ACR is a current regulator (an Auto Current Regulator) constituted by a proportional (P) controller or the like, CMP is a comparator, and GD is a gate driver circuit.

In this conventional technology, a current $I_L$ amplitude command output from the voltage regulator AVR is multiplied with a voltage-divided value of a rectified voltage $V_r$ to obtain an $I_L$ instantaneous value command, which is then compared with the $I_L$ sense value to generate a corresponding output signal through the current regulator ACR. Then, the difference between the voltage-divided value of the rectified voltage $V_r$ and the output of the current regulator ACR is obtained as an output voltage instantaneous value command $V_{sw}^*$, which is then compared with a carrier signal in order to generate a PWM waveform. This PWM waveform is then inverted and input to the gate driver circuit GD, which generates a gate signal for switching the switching device Q1 ON and OFF.

This conventional technology similarly makes it possible to improve the input power factor by controlling the AC input current $I_{in}$ to be a sine wave having the same phase as the AC input voltage $V_{in}$.

RELATED ART DOCUMENTS

Patent Documents

Patent Document 1: Japanese Patent Application Laid-Open Publication No. 2006-87288 (paragraphs [0015] to [0022], FIGS. 1 to 5, and the like)
Patent Document 2: Japanese Patent Application Laid-Open Publication No. 2016-93001 (paragraphs [0002] to [0015], FIGS. 3 to 5, and the like)

Non-Patent Document

Non-Patent Document 1: "PFC Converter Design with IR1150 One Cycle Control IC. Application Note AN-1077.", International Rectifier, [online], Published June 2005, Searched Sep. 11, 2017, Internet (URL: HYPERLINK "https://www.infineon.com/dgdl/an-1077.pdf?fileId=5546d462533600a40153559563801007")

SUMMARY OF THE INVENTION

In the PFC circuit described in Patent Document 2 and illustrated in FIG. 8, the voltage-divided value of the rectified voltage $V_r$ needs to be input to the control circuit, and therefore loss due to the voltage-dividing resistors R1 and R2 occurs continuously. In recent years, there has been demand for minimizing so-called standby power as much as possible, and it is preferable that even small resistive losses do not occur.

Although the PFC circuit described in Patent Document 1 and illustrated in FIGS. 4 and 5 addresses this problem by eliminating the need to detect a rectified voltage and the like, this approach involves manipulating the amplitude (by changing the slope) of a ramp wave for use as a carrier signal, which means that under certain conditions this amplitude can become relatively small. However, when the amplitude of the carrier signal becomes small, the effects of noise become more prominent when performing PWM operations, which results in increased distortion of the current waveform.

Therefore, an object to be achieved by the present invention is to provide an AC-DC converter which eliminates the need for a unit for detecting AC input voltage or a rectified voltage thereof and also makes it possible to improve input power factor without distorting the current waveform. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides an AC-DC converter that converts an AC power supply voltage to a DC output voltage of a prescribed magnitude with power factor regulation, including: a rectifying circuit that rectifies the AC power supply voltage to output a rectified voltage; a reactor that receives the rectified voltage; a semiconductor switching device connected in series to the reactor; a voltage regulation unit that receives a detected value of the DC output voltage and a command value and that outputs an amplitude command for the rectified current that represents a difference between the detected value of the DC output voltage and the command value; an instantaneous value command calculator that receives the amplitude command from the voltage regulation unit and an estimated value of the rectified voltage that is obtained without actually detecting the rectified voltage and that calculates an instantaneous value command for the rectified current from the amplitude command and the estimated value of the rectified voltage; a current regulation unit that receives the instantaneous value command from the instantaneous value command calculator and a detected value of a rectified current flowing through the reactor and that outputs a signal representing a difference between the instantaneous value command and the detected value of the rectified current; an output voltage command calculator that receives the signal outputted from the current regulation unit and the estimated value of the rectified voltage and that calculates an output voltage command for the semiconductor switching device from the signal outputted from the current regulation unit and the estimated value of the rectified voltage; a drive signal generator that receives the output voltage command from the output voltage command calculator and a carrier signal and that generates a drive signal for the semiconductor switching device from the output voltage command and the carrier signal, the driving signal being provided to the semiconductor switching device so as to switch the semiconductor switching device ON and OFF; and a rectified voltage estimation unit that receives the output voltage command from the output voltage command calculator and that derives the estimated value of the rectified voltage from the output voltage command without actually detecting the rectified voltage, for providing to the instantaneous value command calculator and the output voltage command calculator.

In the above-mentioned AC-DC converter, the rectified voltage estimation unit may derive the estimated value of the rectified voltage using a duty cycle of the semiconductor switching device. the estimated value of the rectified voltage is generated from the output voltage command that is proportional to a duty cycle of the semiconductor switching device.

In the above-mentioned AC-DC converter, the rectified voltage estimation unit may derive the estimated value of the rectified voltage using OFF time ratio of the semiconductor switching device.

In the above-mentioned AC-DC converter, the rectified voltage estimation unit may derive the estimated value of the rectified voltage by calculating an average value of the output voltage command over one switching cycle of the semiconductor switching device.

In the above-mentioned AC-DC converter, the rectified voltage estimation unit may derive the estimated value of the rectified voltage by removing high-frequency ripple components from the output voltage command.

In the above-mentioned AC-DC converter, the rectified voltage estimation unit may include a low-pass filter or a band-pass filter.

In the above-mentioned AC-DC converter, the voltage regulation unit may include: a subtractor that receives the detected value of the DC output voltage and the command value as inputs; and a voltage regulator connected to an output of the subtractor.

In the above-mentioned AC-DC converter, the current regulation unit may include: a subtractor that receives the instantaneous value command and the detected value of the rectified current as inputs; and a current regulator connected to an output of the subtractor.

In the above-mentioned AC-DC converter, the instantaneous value command calculator may be a multiplier that multiplies the amplitude command by the estimated value of the rectified voltage to generate the instantaneous value command.

In the above-mentioned AC-DC converter, the output voltage command calculator may be a subtractor that receives the signal outputted from the current regulation unit and the estimated value of the rectified voltage and that outputs a difference between the signal outputted from the current regulation unit and the estimated value of the rectified voltage as the output voltage command.

In the above-mentioned AC-DC converter, the rectified voltage estimation unit may include: a first low-pass filter that receives the output voltage command from the output voltage command calculator, an output of the first low-pass filter being provided to the output voltage command calculator as the estimated value of the rectified voltage to be used in the output voltage command calculator; and a second low-pass filter that receives the output of the first low-pass filter, an output of the second low-pass filter being provided to the instantaneous value command calculator as the estimated value of the rectified voltage to be used in the instantaneous value command calculator.

In the present invention, the rectified voltage is estimated without using voltage-dividing resistors to detect the AC power supply voltage or a rectified voltage thereof, and the switching device is PWM-controlled using the output voltage command based on the rectified current (reactor current) instantaneous value command generated from this estimated value. This makes it possible to reduce resistive loss and improve efficiency in comparison to in conventional technologies.

Moreover, whereas the conventional technology disclosed in Patent Document 1 relies on manipulating the amplitude of a carrier signal and is therefore more prone to the effects of noise during PWM operations when this amplitude is small, the present invention makes it possible to use a carrier signal of constant amplitude, thereby making it possible to achieve high input power factor accuracy with no risk of suffering noise effects.

It is to be understood that both the foregoing general description and the following detailed description are exemplary and explanatory, and are intended to provide further explanation of the invention as claimed.

DETAILED DESCRIPTION OF EMBODIMENTS

An embodiment of the present invention will be described with reference to figures.

Figure 1:
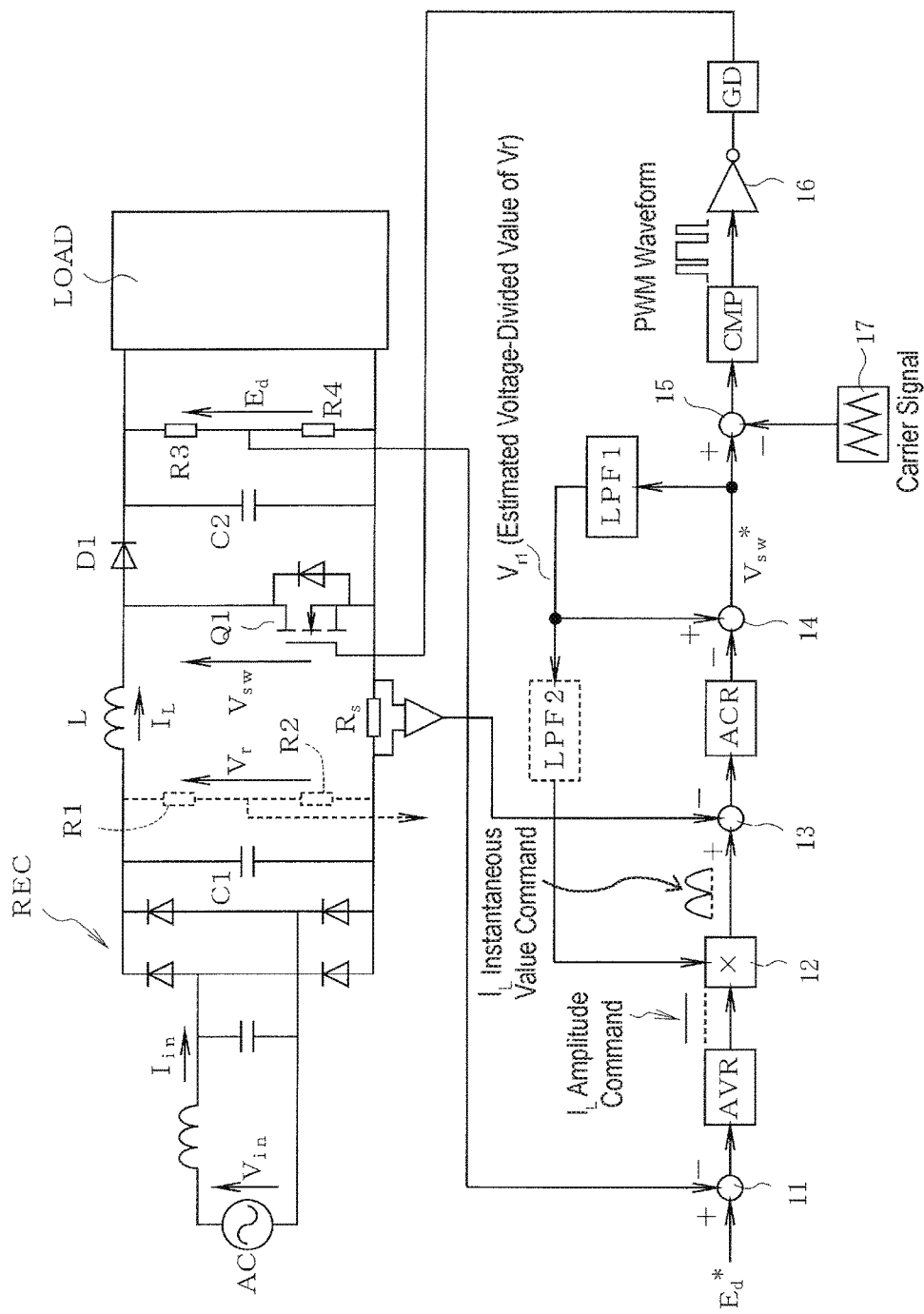
FIG. 1 is a block diagram illustrating the configuration of an embodiment of the present invention.

FIG. 1 is a block diagram of a PFC circuit for use as an AC-DC converter according to this embodiment of the present invention. Components in FIG. 1 that are the same as in FIG. 8 are given the same reference characters as in FIG. 8, and the following description will focus on the portions that are different from in FIG. 8.

Figure 8:
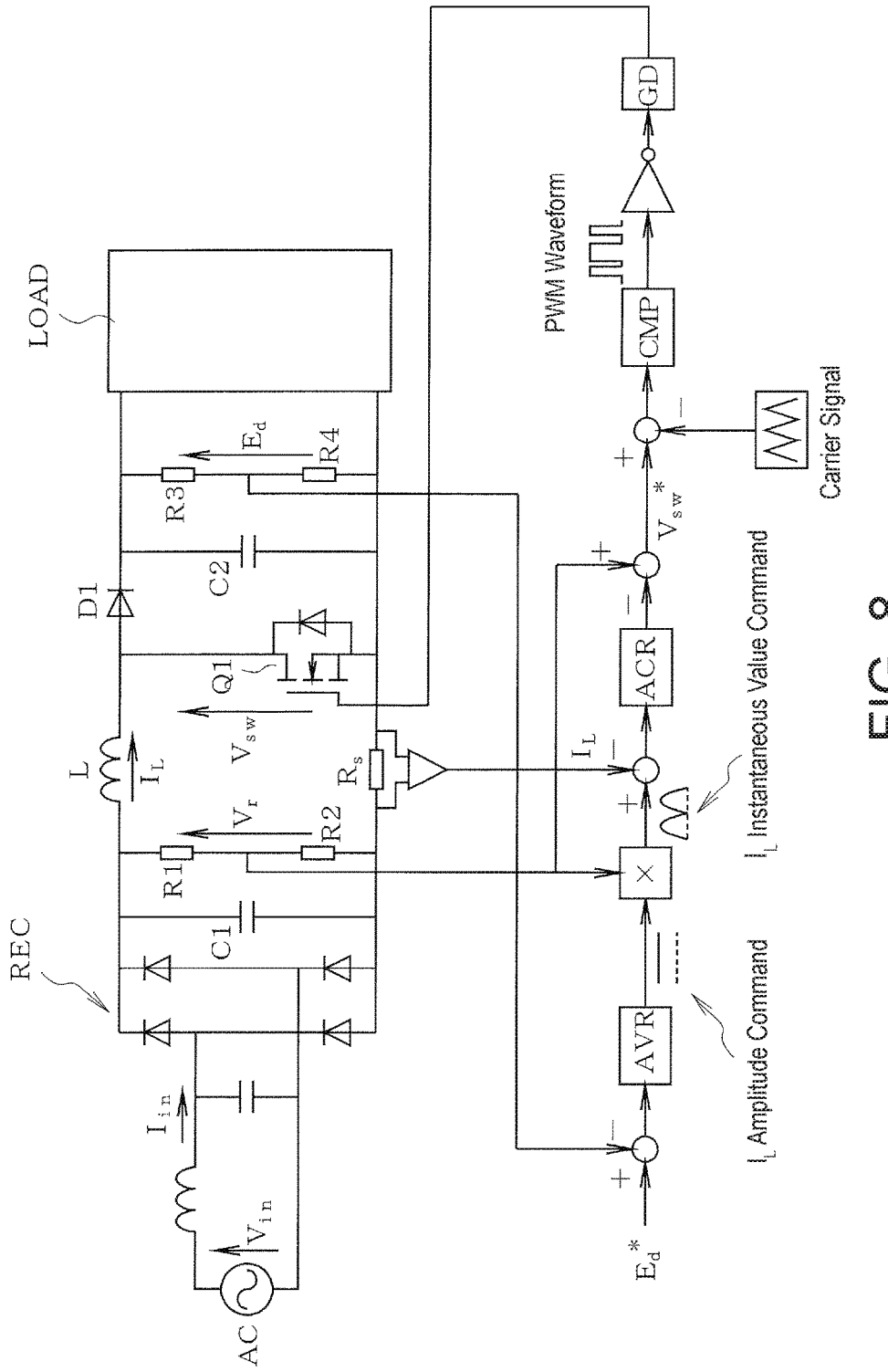
FIG. 8 illustrates the configuration of a PFC circuit disclosed in Patent Document 2.

The configuration of a main circuit in FIG. 1 is the same as in FIG. 8 except in that the voltage-dividing resistors R1 and R2 (indicated by the dashed lines in FIG. 1) are removed. Moreover, the configuration of a control circuit is the same as in FIG. 8 except in that a voltage $V_{r1}$ (an estimated voltage-divided value of a rectified voltage $V_r$) output from a low-pass filter LPF1 is input to a multiplier 12 and to a subtractor 14 instead of the voltage-divided value generated by the voltage-dividing resistors R1 and R2 in FIG. 8.

In this control circuit, similar to in FIG. 8, a subtractor 11 calculates a voltage deviation between a DC output voltage $E_d$ (that is, a voltage-divided value thereof) detected by voltage-dividing resistors R3 and R4 on the output side of the main circuit and a command value $E_d^*$. A voltage regulator AVR on the output side of the subtractor 11 is constituted by a PI controller or the like and operates to reduce this voltage deviation to zero in order to output a rectified current (reactor current) $I_L$ amplitude command.

The $I_L$ amplitude command is input to the multiplier 12 and multiplied with the voltage $V_{r1}$ (estimated voltage-divided value of the rectified voltage $V_r$) output from the low-pass filter LPF1. This multiplication result is then input to a subtractor 13 as an $I_L$ instantaneous value command.

Here, the low-pass filter LPF1 removes ripple components and the like which are introduced into the current $I_L$ by a current control system such as a current regulator ACR (described below). Moreover, a low-pass filter LPF2 between the low-pass filter LPF1 and the multiplier 12 is a filter for removing noise and distortion but is not necessarily required in the present invention.

A current sense value $I_L$ from a current sense resistor $R_s$ in the main circuit is input to the subtractor 13 on the output side of the multiplier 12, and then a current deviation between the $I_L$ instantaneous value command and the current sense value $I_L$ is calculated and input to a current regulator ACR such as a P controller.

The current regulator ACR operates to reduce this current deviation to zero, and the difference between the estimated voltage-divided value $V_{r1}$ of the rectified voltage $V_r$ and the output of the current regulator ACR is then calculated by the subtractor 14 and becomes an output voltage command $V_{sw}^*$ for a switching device Q1. Then, a subtractor 15 and a comparator CMP compare this output voltage command $V_{sw}^*$ to a carrier signal from a carrier signal generator 17 in order to generate a PWM waveform. This PWM waveform is input via a sign inverter 16 to a gate driver circuit GD, which generates a gate signal for switching the switching device Q1 ON and OFF.

Next, the estimated voltage-divided value $V_{r1}$ will be described.

In the present embodiment, the average value of the output voltage command $V_{sw}^*$ over one switching cycle is used as the estimated voltage-divided value $V_{r1}$ of the rectified voltage $V_r$ instead of using the input voltage $V_r$ of the reactor L.

The $I_L$ instantaneous value command output from the multiplier 12 is a signal obtained by multiplying the output signal (that is, the estimated voltage-divided value of the rectified voltage $V_r$) of the low-pass filter LPF1 with the $I_L$ amplitude command and therefore has a frequency of two times the commercial frequency. When the switching frequency of the switching device Q1 is sufficiently greater than this commercial frequency, the rectified current $I_L$ and the rectified voltage $V_r$ can be treated as being DC current/voltage of substantially constant magnitude over a single switching cycle.

When instantaneous value control of $I_L$ takes effect and the $I_L$ sense value becomes substantially equal to the $I_L$ command value (ignoring switching frequency components; same applies below), the rate of change in the current can be treated as being negligible, and the terminal voltage of the reactor L can be treated as being substantially equal to zero (that is, the voltages of both terminals are substantially equal). Thus, the rectified voltage $V_r$ applied to one end of the reactor L is substantially equal to the average value of a terminal voltage $V_{sw}$ of the switching device Q1 applied to the other end of the reactor L. Moreover, letting the Off time ratio (the OFF time period) of the switching device Q1 be α, the average value of $V_{sw}$ is equal to $\alpha \times E_d$ (where $E_d$ is DC output voltage).

Therefore, when the voltage regulator AVR reaches steady-state operation and the DC output voltage $E_d$ matches the voltage command value $E_d^*$, $V_r$ can be estimated from the following relationship if α and $E_d$ are known:

$$V_r \approx \text{Average value of } V_{sw} = \alpha \times E_d$$

Next, the relationship between $V_{sw}$, the average value of $V_{sw}$, the OFF time ratio α, $V_r$, and the current $I_L$ will be described with reference to FIGS. 2 to 3D.

Figure 2:
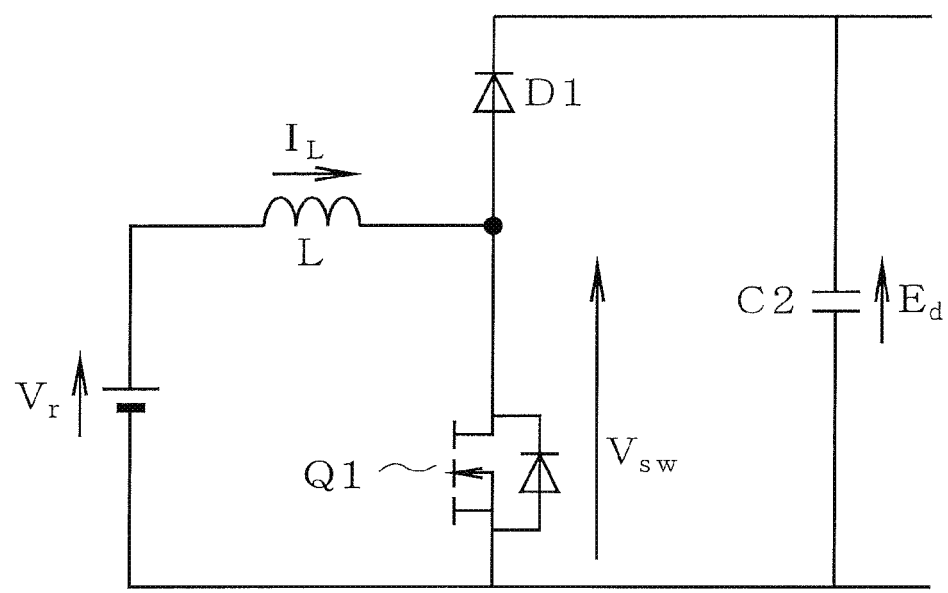
FIG. 2 is a circuit diagram illustrating a main portion of the configuration illustrated in FIG. 1.
Figure 3A:
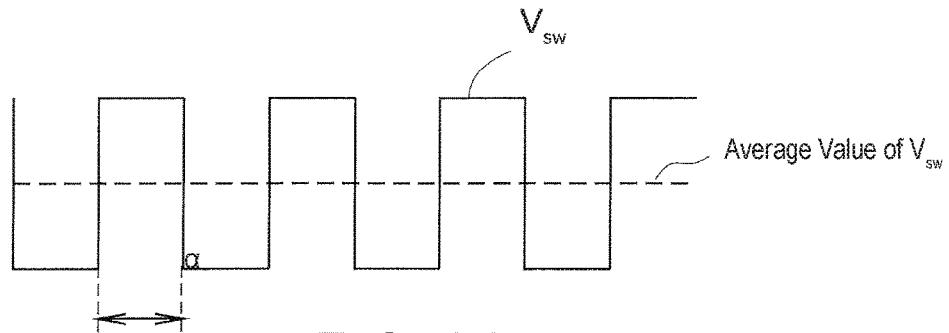
FIGS. 3A to 3D are waveform diagrams each illustrating operation of the embodiment of the present invention.
Figure 3B:
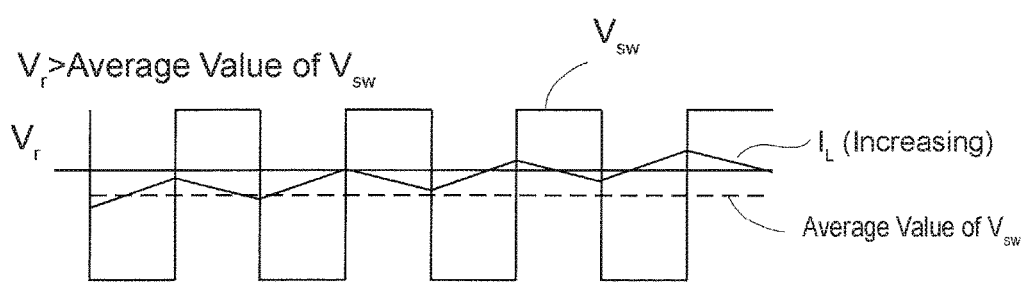
Figure 3C:
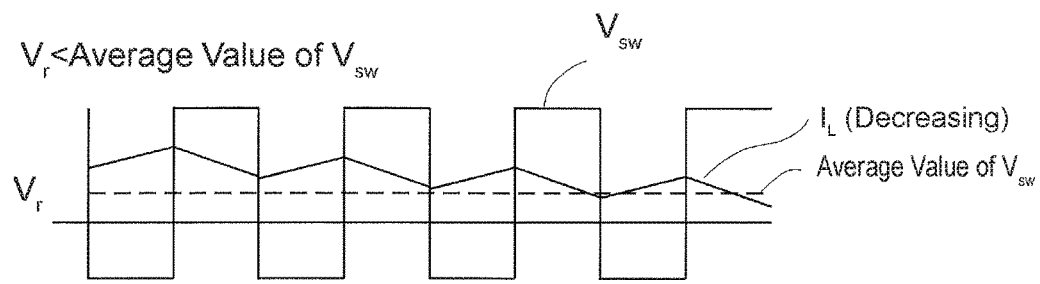
Figure 3D:
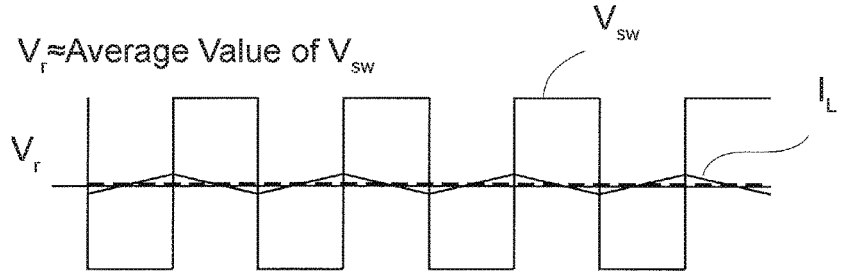
Figure 4:
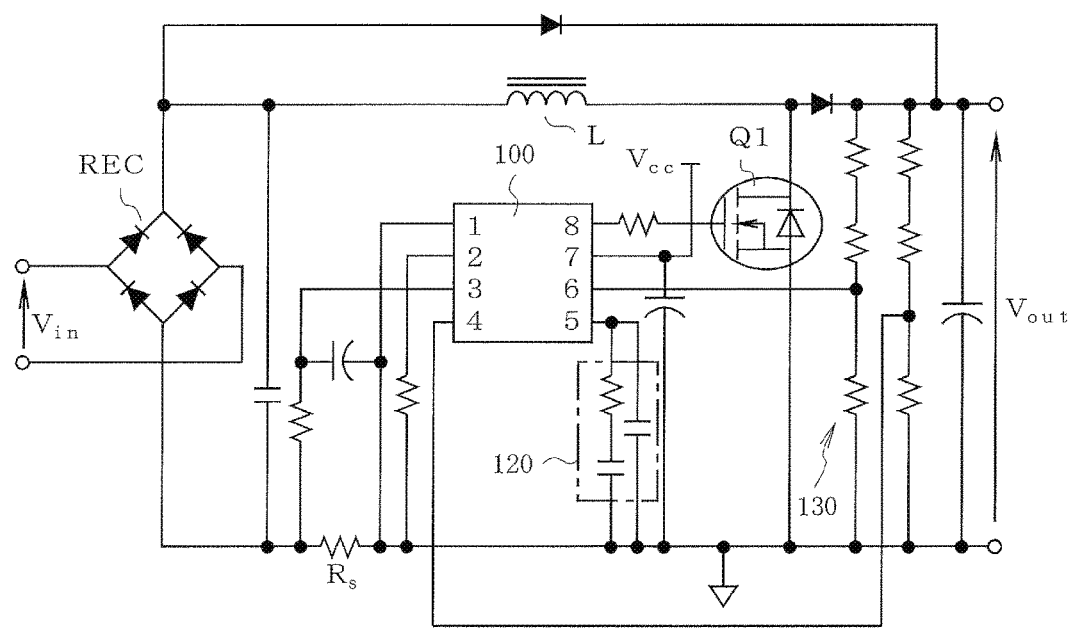
FIG. 4 illustrates the configuration of a PFC circuit disclosed in Patent Document 1.
Figure 5:
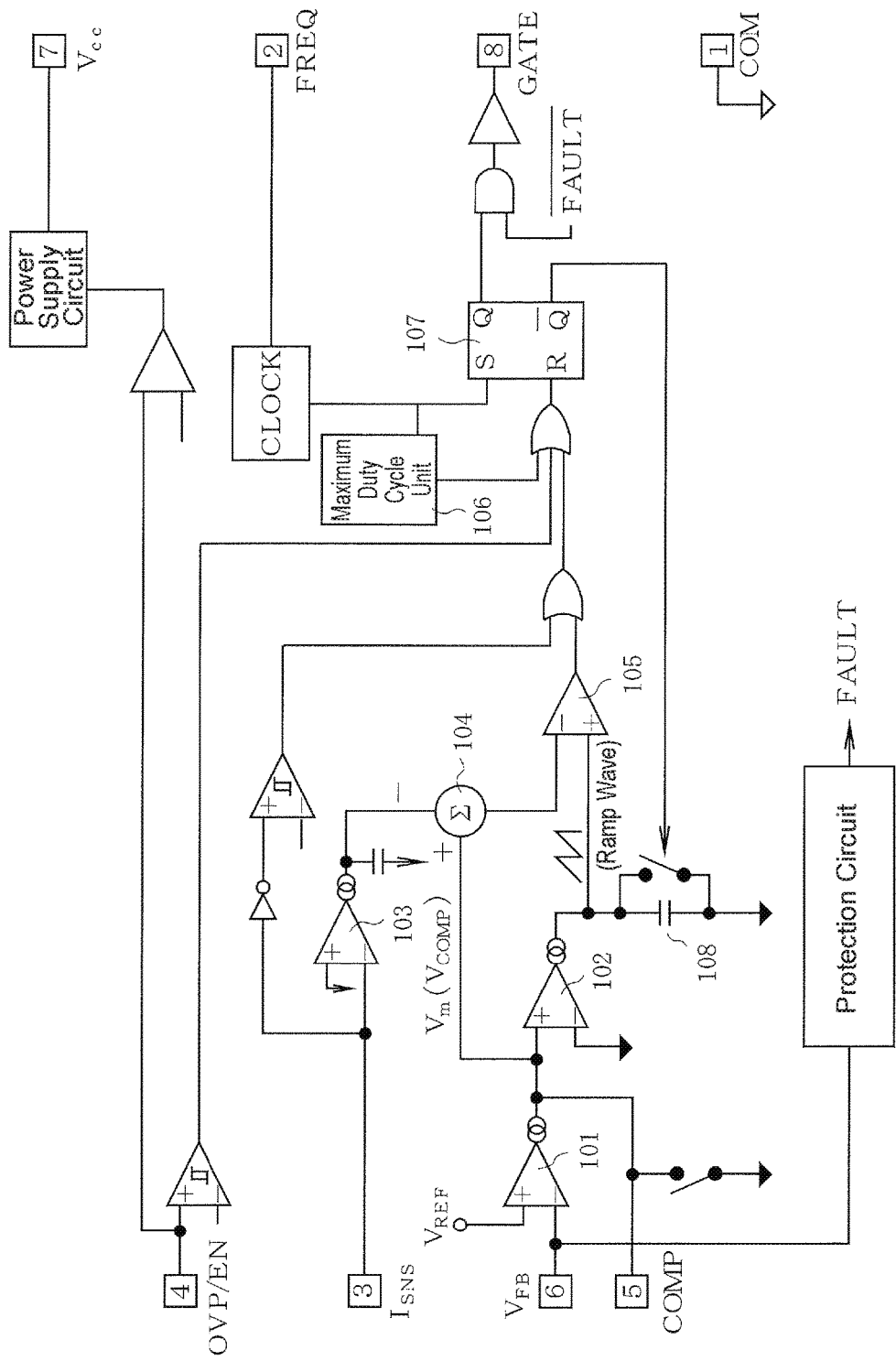
FIG. 5 illustrates the internal configuration of the integrated circuit in FIG. 4.
Figure 6:
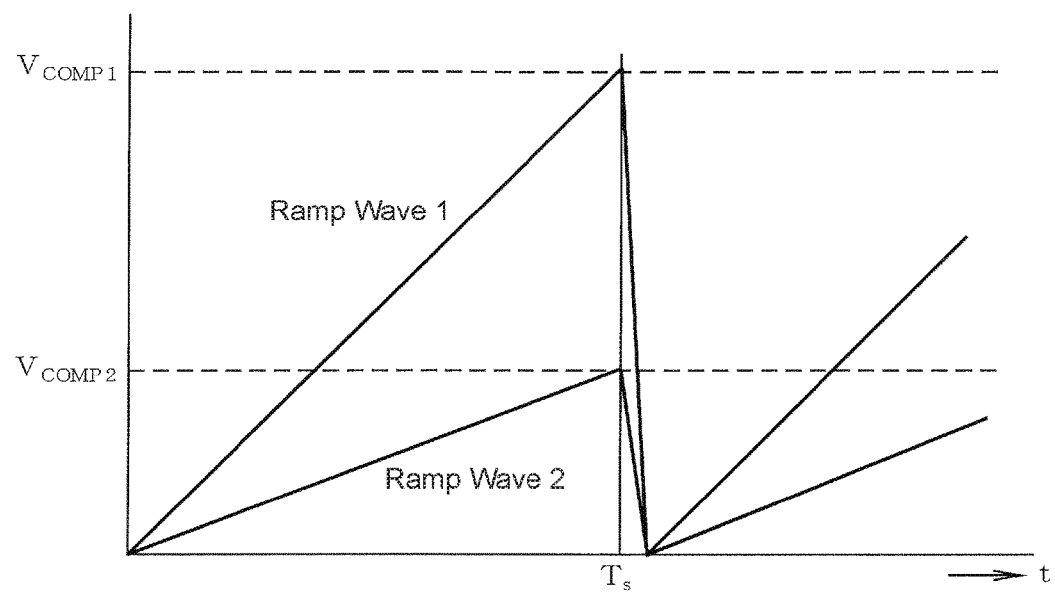
FIG. 6 is a waveform diagram illustrating the relationship between a compensation voltage and a ramp wave in FIG. 5.
Figure 7:
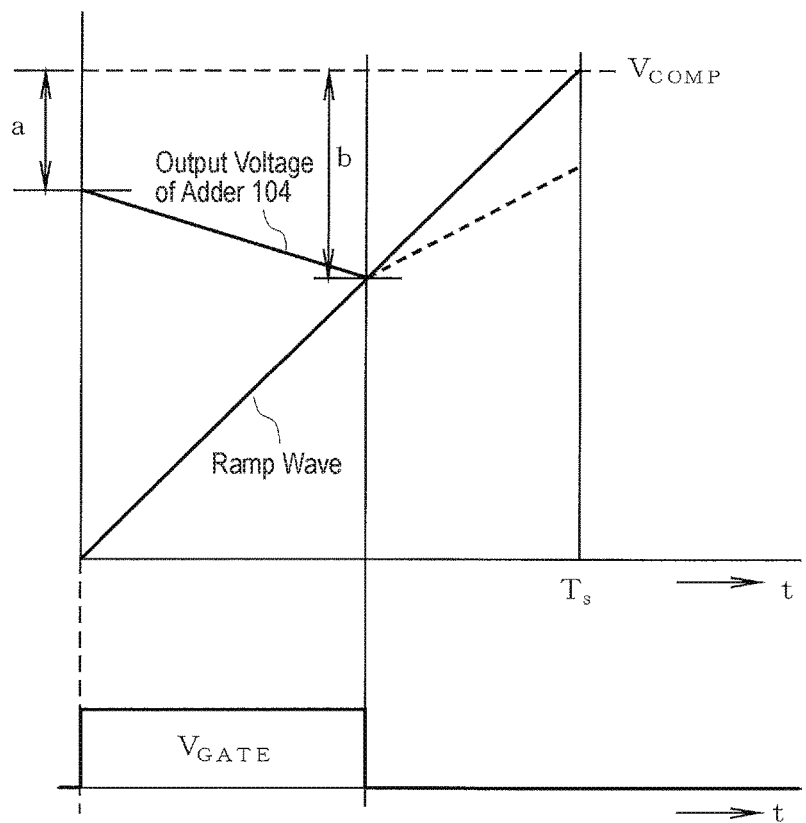
FIG. 7 is a waveform diagram illustrating the relationship between the ramp wave and an output voltage of an adder in FIG. 5.

FIG. 2 illustrates a main portion of the main circuit illustrated in FIG. 1. In FIG. 2, the terminal voltage of the reactor L is given by $V_r - V_{sw} = L(di/dt)$, where L is the inductance of the reactor L. Moreover, FIG. 3A shows the average value of $V_{sw}$, and FIGS. 3B and 3C show the current $I_L$ corresponding to different magnitude relationships between $V_r$ and the average value of $V_{sw}$.

When $I_L$ is fed back and $I_L$ becomes substantially constant at near the $I_L$ instantaneous value command due to the control system in FIG. 1, the average value of the terminal voltage of the reactor L becomes substantially equal to 0 V. Thus, as illustrated in FIG. 3D, at this point in time the relationship $V_r \approx$ Average value of $V_{sw}$ holds. Moreover, although the details will not be described here, by assuming that in FIG. 3D the magnitude of increase in the rectified current $I_L$ during the period α and the magnitude of decrease in the rectified current $I_L$ during the period other than the period α are equal to one another, the relationship $V_r \approx$ Average value of $V_{sw} = \alpha \times E_d$ can be derived.

Therefore, as described above, if α and $E_d$ are known, $V_r$ can be estimated from the average value of $V_{sw}$.

Furthermore, allowing the voltage-dividing ratio of $V_{r1}$ relative to $V_r$ to be K1, the above relationship $V_r = \alpha \times E_d$ can be used to obtain $V_{r1} = \alpha K1 \times E_d$. Then, based on the principle of operation (that α is determined by the period of time until the carrier signal becomes equal to the output voltage command $V_{sw}^*$), $V_{sw}^*$ is proportional to α, and therefore $V_{sw}^* = K2\alpha$ (where K2 is a proportionality constant). Thus, $\alpha = V_{sw}^*/K2$.

Therefore, $V_{r1} = (K1/K2) \times (E_d \cdot V_{sw}^*)$, and if the constants (including $E_d$) are selected such that $(K1/K2) \times E_d = 1$, using the output voltage command $V_{sw}^*$ itself as the estimated voltage-divided value $V_{r1}$ then makes it possible to estimate $V_r$.

Although here $E_d$ (that is, the voltage-divided value thereof) is fed back to the input side of the voltage regulator AVR and controlled so as to match the command value $E_d^*$, if there is a need to increase the accuracy of the estimated voltage-divided value $V_{r1}$ by accounting for DC voltage ripple or for offset between the command value and the detected value, it is preferable that $E_d$ be multiplied with V.

As described above, the present embodiment makes it possible to calculate the output voltage command $V_{sw}^*$ without detecting the AC power supply voltage or a rectified voltage therefrom. Moreover, this approach does not rely on changing the amplitude of the carrier signal, which makes it possible to control the AC input current waveform to be an undistorted sine wave and thereby makes it possible to improve the input power factor.

In addition, the low-pass filters LPF1 and LPF2 may be replaced with band-pass filters. In other words, the signal can be passed through any type of high-frequency ripple removal unit or attenuation unit (including low-pass filters or band-pass filters) to generate the estimated value of the rectified voltage, and furthermore, this estimated value of the rectified voltage can then be passed through any type of rectified sine wave waveform distortion removal unit or attenuation unit (including low-pass filters or band-pass filters) to generate the instantaneous value command for the rectified current.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. An AC-DC converter that converts an AC power supply voltage to a DC output voltage of a prescribed magnitude with power factor regulation, comprising:
    a rectifying circuit that rectifies the AC power supply voltage to output a rectified voltage;
    a reactor that receives the rectified voltage;
    a semiconductor switching device connected in series to the reactor;
    a voltage regulation unit that receives a detected value of the DC output voltage and a command value and that outputs an amplitude command for the rectified current that represents a difference between the detected value of the DC output voltage and the command value;
    an instantaneous value command calculator that receives the amplitude command from the voltage regulation unit and an estimated value of the rectified voltage that is obtained without actually detecting the rectified voltage and that calculates an instantaneous value command for the rectified current from the amplitude command and the estimated value of the rectified voltage;
    a current regulation unit that receives the instantaneous value command from the instantaneous value command calculator and a detected value of a rectified current flowing through the reactor and that outputs a signal representing a difference between the instantaneous value command and the detected value of the rectified current;
    an output voltage command calculator that receives the signal outputted from the current regulation unit and the estimated value of the rectified voltage and that calculates an output voltage command for the semiconductor switching device from the signal outputted from the current regulation unit and the estimated value of the rectified voltage;
    a drive signal generator that receives the output voltage command from the output voltage command calculator and a carrier signal and that generates a drive signal for the semiconductor switching device from the output voltage command and the carrier signal, the driving signal being provided to the semiconductor switching device so as to switch the semiconductor switching device ON and OFF; and
    a rectified voltage estimation unit that receives the output voltage command from the output voltage command calculator and that derives the estimated value of the rectified voltage from the output voltage command without actually detecting the rectified voltage, for providing to the instantaneous value command calculator and the output voltage command calculator.

2. The AC-DC converter according to claim 1, wherein the rectified voltage estimation unit derives the estimated value of the rectified voltage using a duty cycle of the semiconductor switching device.

3. The AC-DC converter according to claim 1, wherein the rectified voltage estimation unit derives the estimated value of the rectified voltage using OFF time ratio of the semiconductor switching device.

4. The AC-DC converter according to claim 1, wherein the rectified voltage estimation unit derives the estimated value of the rectified voltage by calculating an average value of the output voltage command over one switching cycle of the semiconductor switching device.

5. The AC-DC converter according to claim 1, wherein the rectified voltage estimation unit derives the estimated value of the rectified voltage by removing high-frequency ripple components from the output voltage command.

6. The AC-DC converter according to claim 1, wherein the rectified voltage estimation unit includes a low-pass filter or a band-pass filter.

7. The AC-DC converter according to claim 1,
    wherein the voltage regulation unit includes:
        a subtractor that receives the detected value of the DC output voltage and the command value as inputs; and
        a voltage regulator connected to an output of the subtractor.

8. The AC-DC converter according to claim 1,
    wherein the current regulation unit includes:
        a subtractor that receives the instantaneous value command and the detected value of the rectified current as inputs; and
        a current regulator connected to an output of the subtractor.

9. The AC-DC converter according to claim 1,
    wherein the instantaneous value command calculator is a multiplier that multiplies the amplitude command by the estimated value of the rectified voltage to generate the instantaneous value command.

10. The AC-DC converter according to claim 1,
    wherein the output voltage command calculator is a subtractor that receives the signal outputted from the current regulation unit and the estimated value of the rectified voltage and that outputs a difference between the signal outputted from the current regulation unit and the estimated value of the rectified voltage as the output voltage command.

11. The AC-DC converter according to claim 1,
    wherein the rectified voltage estimation unit includes:
        a first low-pass filter that receives the output voltage command from the output voltage command calculator, an output of the first low-pass filter being provided to the output voltage command calculator as the estimated value of the rectified voltage to be used in the output voltage command calculator; and
        a second low-pass filter that receives the output of the first low-pass filter, an output of the second low-pass filter being provided to the instantaneous value command calculator as the estimated value of the rectified voltage to be used in the instantaneous value command calculator.

12. The AC-DC converter according to claim 1,
    wherein the voltage regulation unit includes:
        a subtractor that receives the detected value of the DC output voltage and the command value as inputs; and
        a voltage regulator connected to an output of the subtractor,
    wherein the current regulation unit includes:
        a subtractor that receives the instantaneous value command and the detected value of the rectified current as inputs; and
        a current regulator connected to an output of the subtractor,
    wherein the instantaneous value command calculator is a multiplier that multiplies the amplitude command by the estimated value of the rectified voltage to generate the instantaneous value command, and
    wherein the output voltage command calculator is a subtractor that receives the signal outputted from the current regulation unit and the estimated value of the rectified voltage and that outputs a difference between the signal outputted from the current regulation unit and the estimated value of the rectified voltage as the output voltage command.

* * * * *